(12) United States Patent
Voiron et al.

(10) Patent No.: US 12,054,838 B2
(45) Date of Patent: *Aug. 6, 2024

(54) SEMICONDUCTOR DEVICE HAVING POROUS REGION EMBEDDED STRUCTURE AND METHOD OF MANUFACTURE THEREOF

(71) Applicants: Murata Manufacturing Co., Ltd., Nagaokakyo (JP); COMMISSARIAT A L'ENERGIE ATOMIQUE ET AUX ENERGIES ALTERNATIVES, Paris (FR)

(72) Inventors: Frédéric Voiron, Barraux (FR); Julien El Sabahy, Grenoble (FR); Maxime Lemenager, Caen (FR); Guy Parat, Claix (FR)

(73) Assignees: MURATA MANUFACTURING CO., LTD, Nagaokakyo (JP); COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 820 days.

This patent is subject to a terminal disclaimer.

(21) Appl. No.: 17/075,154

(22) Filed: Oct. 20, 2020

(65) Prior Publication Data
US 2021/0032766 A1 Feb. 4, 2021

Related U.S. Application Data

(63) Continuation of application No. PCT/EP2019/060018, filed on Apr. 17, 2019.

(30) Foreign Application Priority Data
Apr. 20, 2018 (EP) .................................. 18305492

(51) Int. Cl.
C25D 11/02 (2006.01)
C25D 11/04 (2006.01)
(Continued)

(52) U.S. Cl.
CPC .......... *C25D 11/022* (2013.01); *C25D 11/045* (2013.01); *C25D 11/06* (2013.01);
(Continued)

(58) Field of Classification Search
CPC ..... C25D 11/022; C25D 11/045; C25D 11/12; C25D 11/24; C25D 11/26; H01L 23/5223; H01L 23/53223; H01L 28/75
See application file for complete search history.

(56) References Cited

U.S. PATENT DOCUMENTS

| 3,285,836 A | 11/1966 | Maissel et al. |
| 5,194,136 A | 3/1993 | Jeung et al. |

(Continued)

FOREIGN PATENT DOCUMENTS

| EP | 2458037 A1 | 5/2012 |
| GB | 1060257 A | 3/1967 |
| WO | 2015063420 A1 | 5/2015 |

OTHER PUBLICATIONS

Xiaowei, Zhao et al.; "Patterned anodic aluminium oxide fabricated with a Ta Mask"; Nanotechnology, vol. 17, Nov. 25, 2005, pp. 35-39.

(Continued)

*Primary Examiner* — Sonya McCall-Shepard
(74) *Attorney, Agent, or Firm* — ArentFox Schiff LLP

(57) ABSTRACT

A semiconductor device that includes a porous anodic region for embedding a structure. The porous anodic region is defined by a ductile hard mask. The ductility of the hard mask reduces the potential for the hard mask to crack during the formation by anodization of the porous anodic region.

(Continued)

The ductile hard mask may be a metal. The metal may be selected to form a stable oxide when exposed to the anodization electrolyte thereby enabling the hard mask to self-repair if a crack occurs during the anodization process.

14 Claims, 7 Drawing Sheets

(51) Int. Cl.
    *C25D 11/06*     (2006.01)
    *C25D 11/08*     (2006.01)
    *C25D 11/18*     (2006.01)
    *C25D 11/24*     (2006.01)
    *C25D 11/26*     (2006.01)
    *H01L 23/522*     (2006.01)
    *H01L 23/532*     (2006.01)
    *H01L 49/02*     (2006.01)

(52) U.S. Cl.
    CPC .......... *C25D 11/18* (2013.01); *H01L 23/5223* (2013.01); *H01L 23/53223* (2013.01); *H01L 28/75* (2013.01)

(56) References Cited

U.S. PATENT DOCUMENTS

| | | | |
|---|---|---|---|
| 6,280,640 B1 * | 8/2001 | Hurwitz | H01L 21/4846 257/E23.06 |
| 2005/0098205 A1 | 5/2005 | Roscheisen et al. | |
| 2008/0093744 A1 | 4/2008 | Wang et al. | |
| 2011/0073827 A1 * | 3/2011 | Rubloff | H01L 29/0676 438/129 |
| 2016/0268144 A1 | 9/2016 | Voiron et al. | |

OTHER PUBLICATIONS

International Search Report issued for PCT/EP2019/060018, date of mailing Jun. 6, 2019.
Written Opinion of the International Searching Authority issued for PCT/EP2019/060018, date of mailing Jun. 6, 2019.
European Search Report issued for EP 18 30 5492., date of mailing Oct. 25, 2018.
Jeong G H et al.; "Nano-pore arrays of anodic aluminum oxide fabricated using a Cr mask 11"; Microprocesses and Nanotechnology, 2007 Digest of Papers, IEEE, Piscataway, NJ, USA, Nov. 5, 2007, pp. 192-193.
Parag Banerjee et al; "Nanotubular metal-insulator-metal capacitor arrays for energy storage"; Nature Nanotechnology, vol. 4, No. 5, May 2009, pp. 292-296.
Stephens J R et al.; "Ductility Mechanisms and Superplasticity in Chromium Alloys"; Nasa Technical Note, Jan. 1, 1968, Retrieved from the Internet: URL:https://ntrs.nasa.gov/archive/nasa/casi.ntrs.nasa.gov/19680004504. pdf [retrieved on May 23, 2019].
Zhao X et al.; "Anodizing Behavior of Aluminum Foil Patterned with SiO2 Mask"; Journal of the Electrochemical Society, vol. 152, (10), 2005, pp. B411-B414.
Cosse J T et al.; "Minimization of undercutting in electrochemical micromachining of patterned aluminum-copper films"; J. Micromech. Microeng., vol. 17, 2007, pp. 89-97.
Brevnov D.; "Electrochemical Micromachining of Patterned Aluminum Films by Porous-type Anodization"; ECS Transactions, vol. 3, Jan. 1, 2007, pp. 11-17.

* cited by examiner

SEMICONDUCTOR DEVICE HAVING POROUS REGION EMBEDDED STRUCTURE AND METHOD OF MANUFACTURE THEREOF

CROSS REFERENCE TO RELATED APPLICATIONS

The present application is a continuation of International application No. PCT/EP2019/060018, filed Apr. 17, 2019, which claims priority to European Patent Application No. 18305492.3, filed Apr. 20, 2018, the entire contents of each of which are incorporated herein by reference.

FIELD OF THE INVENTION

The present invention relates to the field of integration and, more particularly, to electronic products, related semiconductor products, and their methods of manufacture.

TECHNICAL BACKGROUND

Silicon passive integration technologies are nowadays accessible for industrial design. For example, the PICS technology developed by Murata Integrated Passive Solutions allows integrating high density capacitive components into a silicon substrate. According to this technology, tens or even hundreds of passive components can be efficiently integrated into a silicon die.

In their work titled "Nanotubular metal-insulator-metal capacitor arrays for energy storage" (published in Natural technology, May 2009), P. Banerjee et al. describe a metal-insulator-metal (MIM) structure formed in a porous anodic material, such as porous anodic alumina (PAA) for example. The successive layers of metal, insulator, and then metal follow the contours of the porous material resulting in the MIM structure being embedded inside the pores of the porous material. Banerjee's PAA embedded structure however suffers from high Equivalent Series Resistance (ESR) and limited capacitance density due to the PAA thickness that can be deposited by Atomic Layer Deposition (ALD).

A structure by F. Voiron et al. that improves Banerjee's ESR and capacitance is described in international application publication WO 2015/063420 A1. Voiron's structure results in highly integrated capacitance that may be used in a variety of applications. In this structure the bottoms of the pores are opened and the lower metal layer of the MIM structure contacts a conductive layer that underlies the porous region, providing electrical contact and reducing ESR.

Generally, PAA embedded structures as described above result from implementing a capacitive stack (the MIM structure) inside a porous region above a substrate, such as a silicon wafer. Typically, the porous region results from anodizing a thin layer of metal, such as aluminum, deposited above the substrate. The anodization converts the aluminum layer into porous anodic alumina. Typically, the porous region is formed so as to be circular (as viewed from the top) and extends across the alumina layer in a direction perpendicular to the wafer surface.

FIG. 1 is a cross-section view of an example structure 100 used in fabricating a product having a porous region. Example structure 100 may be for example an intermediate product in the process of fabricating an integrated capacitor structure as described in WO 2015/063420 A1. Example structure 100 is provided for the purpose of illustrating the formation of the porous region and is not limiting with respect to the types of products that may be generated.

As shown in FIG. 1, structure 100 includes a silicon layer 102, an aluminum layer 104, a barrier layer 106, an aluminum layer 108, and a hard mask layer 110. In an example product, aluminum layer 104 may provide an electrode for an integrated capacitor structure. Barrier layer 106 may provide protection to aluminum layer 104, e.g., by stopping the progression of anodization from reaching aluminum layer 104 and/or in a subsequent PAA etching step of the fabrication process.

In forming the porous region, it may be desirable for some applications to have the resulting porous region embedded within the original aluminum layer. For example, it may be desirable to control the size of the resulting porous region in order to control the size and capacitance of a capacitive structure (e.g., MIM structure) that will be embedded therein. Typically, this is done by applying hard mask layer 110 on top of aluminum layer 108 to mask the area of aluminum layer 108 that is not intended to be anodized. The masking shields this area from contact with the anodization electrolyte, and the porous region is thus formed in the area(s) of aluminum layer 108 where hard mask layer 110 is open.

In existing methods, a silicon dioxide masking layer is used for hard mask layer 110. This choice is driven by several factors, including the availability of a silicon dioxide deposition process at medium/low temperature that is compatible with deposition above an aluminum based stack, the availability of silicon dioxide patterning techniques with good selectivity on an underlying aluminum layer, the resistance of silicon dioxide to the anodization step, and the relatively low stress induced by an oxide layer.

However, the inventors of the present invention have discovered that the use of silicon dioxide for hard mask layer 110 has various drawbacks that affect the reliability of the resulting product.

One drawback relates to the effect that silicon dioxide as a hard mask layer material has on the anodization of the aluminum layer 108. Specifically, the inventors of the present invention have realized that the use of silicon dioxide for hard mask layer 110 weakens the anodization electrical field through the aluminum layer 108 at the boundary(ies) of the section of aluminum layer 108 to be anodized, i.e., where the section to be anodized meets the section of aluminum layer 108 underlying the hard mask layer 110 and that is not intended to be anodized. This weakening of the anodization electrical field results in malformed pores at the edges of the resulting porous region.

FIGS. 2A and 2B are scanning electron microscopy (SEM) images of an example porous region formed using a silicon dioxide hard mask layer which illustrate the above-described problem. Specifically, FIGS. 2A and 2B show a zoomed-in cross-section view of an edge of the formed porous region at two different magnification levels (5000 and 10000× magnification, respectively). As shown in FIG. 2A, the edge of the porous region includes a side region denoted as a "dead-zone" in the figure. The "dead-zone" naming is due to the fact that MIM structures deposited in this region are largely non-functional. This is because, in this region, the pores generally are malformed and/or do not reach the bottom metallic layer (in this case a layer of Tungsten (W)) to enable electrical contact for the deposited MIM structures. This condition can be seen clearly in FIG. 2B. As shown, in the dead-zone, the material underlying the partially open pores consists of an alumina layer in which the pores have not yet developed and, more so closer to the edge, a thick residual ledge of aluminum layer 108. Contact with the bottom W layer is thus impossible in the dead-zone without significant etching of the underlying layers.

In practice, as the inventors of the present invention have been able to determine, the width of the dead-zone is proportional to the thickness of the aluminum layer being anodized (the thicker is the aluminum layer, the wider is the dead-zone). For example, for a porous region resulting from a typical 60V anodization process, the dead-zone may include a malformed area that is approximately 10 microns wide for a 5 microns deep PAA structure or 20 microns wide for a 10 microns deep PAA structure. The residual aluminum ledge near the hard mask edge, while controllable by the anodization process, is typically adjusted between 5 and 20 microns.

This is problematic from a production point of view. FIG. 3 is a graph that illustrates the relationship between the capacitance of an example PAA embedded MIM structure and the size (width) of the structure for different pore thickness (depth) values (2, 5, and 10 microns). In this example PAA embedded MIM structure, structure has a pore diameter of 90 nm and a pore pitch (distance between the centers of adjacent pores) of 138 nm. As shown in FIG. 3, the capacitance of the PAA embedded MIM structure is directly proportional to the size of the structure and to the depth of the pores. However, because of the dead-zone occurrence, structures narrower than 5 microns cannot be made. This affects the lower range of capacitance values that can be viably produced. For example, as shown in FIG. 3, a capacitance below $7 \times 10^{-3}$ nF cannot be obtained for a pore thickness of 10 microns. Similarly, a capacitance below $3.5 \times 10^{-3}$ nF cannot be obtained for a pore thickness of 5 microns, and a capacitance below $1.5 \times 10^{-3}$ nF cannot be obtained for a pore thickness of 2 microns. Furthermore, in certain scenarios, it may be desired to have capacitors of different values cohabiting in the same layout. For capacitive density considerations, the depth of the structure is driven by the larger capacitors, which favors a greater pore depth. The dead-zone occurrence limits the lowest capacitance values that can be embedded in such a structure.

In the case of optimized PAA (i.e., PAA with pore diameters enlarged, e.g., to more than 80 nanometers, after pore formation by anodization), this value is ever higher. This problem is further accentuated by the fact that, in practice, the best yield is obtained for smaller size capacitors, meaning that the overall yield is degraded by this problem.

Another drawback relating to the use of silicon dioxide for hard mask layer 110 is the potential that the hard mask cracks during the anodization of aluminum layer 108. FIGS. 4A and 4B are SEM images that illustrate example cracks that may occur in a silicon dioxide hard mask in forming a porous region that may be used to produce a PAA embedded structure. Specifically, FIGS. 4A and 4B show a zoomed-in cross-section view of an edge of the formed porous region at two different magnification levels (5000 and 35000× magnification, respectively). As shown in FIG. 4A, the formation of the porous region (AAO in the figure) by anodization pushes the hard mask layer upward at the interface with the porous region. This upward push is due to the fact that the alumina that is formed during anodization is greater in volume than the aluminum that it replaces. The silicon dioxide hard mask deforms in response to this upward force but ultimately cracks as shown in FIG. 4A.

The hard mask cracking can have a strong impact on the functionality of the deposited MIM structure. For example, the cracking may cause short-circuit contacts within the structure. Specifically, as the MIM structure is deposited above the hard mask, the MIM structure tends to crack where the hard mask is already cracked. Depending on the defect morphology, this may result in a short-circuit (e.g., when the top electrode of the MIM structure touches the bottom electrode of the MIM structure through the cracked area) or less commonly an open-circuit.

Additionally, as shown in FIG. 4B, the cracking of the hard mask exposes the underlying aluminum layer 108 in subsequent process steps. Depending on the process, the exposed aluminum may corrode as shown in FIG. 4B. The corrosion of the aluminum may grow over time, as shown in FIG. 5, resulting in catastrophic device failure. For example, in one process, the MIM structure that is deposited in the porous region includes a titanium nitride (TiN) layer that provides an electrode of the MIM structure. A chlorine-based precursor used to deposit the TiN layer reacts, through the crack, with the underlying aluminum to form unstable chlorinated residues. At the end of manufacturing, the extent of these chlorinated residues appears compatible with electrical functionality. The residues continue to grow however during product life, catalyzed by the presence of moisture, and may lead to catastrophic device failure.

The present invention has been made in the light of the above problems.

SUMMARY OF THE INVENTION

The present invention provides a method of fabricating a semiconductor device, comprising: forming a first metal layer above a silicon layer; forming a second metal layer above the first metal layer; depositing a ductile hard mask above the second metal layer to define a section within the second metal layer; and anodizing the section of the second metal layer defined by the ductile hard mask to form a porous region comprising an anodic oxide layer having pores.

In an embodiment, the method further comprises: depositing a structure including a first conductive layer, a first insulator layer covering the first conductive layer, and a second conductive layer covering the first insulator layer inside the pores of the porous region; and forming a third metal layer above the structure.

The use of a ductile hard mask allows the hard mask to accommodate the volume increase in the section of the second metal layer being anodized to form the porous region. As the volume of the section being anodized grows due to anodization, the hard mask deforms, with no or minimal cracking, on top of the second metal layer. The reduction in hard mask cracking, which traditionally occurs around the interface(s) between the hard mask, the anodized section, and the non-anodized section of the second metal layer (hereinafter "hard mask interfaces"), improves device reliability by reducing defects due to short-circuit contacts within the deposited structure and/or corrosion within the non-anodized section of the second metal layer.

In an embodiment, the use of a ductile hard mask allows for reducing the thickness of the deposited hard mask compared to the prior art. For example, traditionally, hard masks of at least 1 micron are needed. With a ductile hard mask, the thickness of the hard mask may be reduced below 1 micron. For example, in embodiments, a hard mask in the range of 300 nanometers to 1 micron may be used, depending on the thickness of the second metal layer. This improves the process by requiring less material during fabrication.

In an embodiment, the method of fabricating the semiconductor device further comprises selecting the ductile hard mask so as to self-repair a crack caused by the volume increase of the section of the second metal layer being anodized. In an embodiment, this includes configuring the hard mask to oxidize where the crack occurs but just enough to fill the crack. In an embodiment, configuring the hard mask includes appropriately selecting the material and the thickness of the ductile hard mask, as a function of the anodization electrolyte, to result in a controlled oxidization of the hard mask where the crack occurs in order to fill the crack and stop further oxidization afterwards.

In an embodiment, the ductile hard mask comprises a metal. The metal may be, without limitation, titanium, tantalum, or a metal of equivalent properties, for example. In embodiments, the use of a metal hard mask allows for better control of the electrical field at the boundary(ies) of the section of the second metal layer to be anodized than using traditional hard masks, such as silicon oxide for example. This results in better formed pores of the anodic oxide layer at the hard mask boundary(ies) and reduces the size of "dead-zones" at the periphery of the deposited structure within the porous region. The reduction in the size of "dead-zones" at the periphery of the deposited structure enables smaller size structures (e.g., smaller capacitors) to be obtained. This is advantageous in order to meet the requirements of certain applications as well as because smaller size structures typically have higher yield than larger size structures.

In an embodiment, the deposited structure provides a capacitor and the first and third metal layers provide top and bottom electrodes for the capacitor. The use of a metal hard mask simplifies the process of contacting the bottom electrode (the first metal layer) from the top of the structure. Being metal and conductive, the hard mask no longer needs to be etched to achieve electrical contact with the second metal layer and the first metal layer of the semiconductor device.

In an embodiment, where the ductile hard mask is a metal, the method of fabricating the semiconductor device further comprises selecting an electrolyte for anodizing the section of the second metal layer defined by the ductile hard mask; and selecting the metal of the ductile hard mask such that it forms a stable oxide when exposed to the selected electrolyte. In an embodiment, the second metal layer may be made of aluminum and the electrolyte may include, for example, an organic acid such as an oxalic acid or a carboxylic acid or an inorganic acid such as a sulfuric acid or a phosphoric acid. However, embodiments are not limited by these example materials for the second metal layer and/or the electrolyte. The selection of the metal of the ductile hard mask to form a stable oxide when exposed to the selected electrolyte enables the hard mask to self-repair if a crack occurs during the anodization process. As the crack exposes the metal to the electrolyte leading to its oxidation, the stability (insolubility) of the formed oxide with respect to the electrolyte allows the formed oxide, which is larger in volume than the metal it replaces, to plug the crack.

The present invention also provides a semiconductor device. The semiconductor device may be fabricated using the method described above. The semiconductor device comprises: a silicon layer; a first metal layer, above the silicon layer; a second metal layer above the first metal layer; and a ductile hard mask, above the second metal layer, defining a porous region within the second metal layer, the porous region comprising an anodic oxide layer having pores.

The above-described semiconductor device may be an intermediate product formed during the manufacture of a product according to the invention.

In an embodiment, the semiconductor device further comprises a structure comprising a first conductive layer, a first insulator layer covering the first conductive layer, and a second conductive layer covering the first insulator layer, the structure formed inside the pores of the porous region; and a third metal layer, above the structure.

In an embodiment, the semiconductor device includes a capacitor provided by the structure formed in the porous region. The first and third metal layers provide top and bottom electrodes for the capacitor.

The use of a ductile hard mask reduces hard mask cracking, which traditionally occurs during anodization around the hard mask interface(s). The resulting semiconductor device thus benefits from increased device reliability due to reduced defects due to short-circuit contacts within the deposited structure and/or corrosion within the non-anodized section of the second metal layer.

In an embodiment, the use of a ductile hard mask allows for reducing the thickness of the deposited hard mask compared to the prior art. For example, traditionally, hard masks of at least 1 micron are needed. With a ductile hard mask, the thickness of the hard mask may be reduced below 1 micron. For example, in embodiments, a hard mask in the range of 300 nanometers to 1 micron may be used, depending on the thickness of the second metal layer. This results in the semiconductor device having a thinner profile compared to the prior art.

The ductile hard mask may be a metal, such as titanium, tantalum, or a metal of equivalent properties, for example.

In an embodiment, the porous region is formed by anodizing a section of the second metal layer using an electrolyte, and the metal is characterized by forming a stable oxide when exposed to the electrolyte. In an embodiment, the second metal layer may be made of aluminum and the electrolyte may include, for example, an organic acid such as an oxalic acid or a carboxylic acid or an inorganic acid such as a sulfuric acid or a phosphoric acid. However, embodiments are not limited by these example materials for the second metal layer and/or the electrolyte. The selection of the metal of the ductile hard mask to form a stable oxide when exposed to the selected electrolyte enables the hard mask to self-repair if a crack occurs during the anodization process. As the crack exposes the metal to the electrolyte leading to its oxidation, the stability (insolubility) of the formed oxide allows the formed oxide, which is larger in volume than the metal it replaces, to plug the crack. The stability of the oxide also means that plugged cracks are not dissolved post-manufacture due to exposure to any electrolyte residue inside the device.

BRIEF DESCRIPTION OF THE DRAWINGS

Further features and advantages of the present invention will become apparent from the following description of certain embodiments thereof, given by way of illustration only, not limitation, with reference to the accompanying drawings in which:

FIGS. 7A and 7B are SEM images of example porous regions, in which:

FIG. 7A illustrates an example porous region formed using a silicon dioxide hard mask, and FIG. 7B illustrates an example porous region formed using a ductile hard mask.

DETAILED DESCRIPTION OF EXAMPLE EMBODIMENTS

Embodiments of the present invention address the existing deficiencies of the prior art by using a ductile material for the hard mask layer used to define the porous region in a PAA embedded structure.

The use of a ductile hard mask allows the hard mask to accommodate the volume increase in the section of the metal layer (e.g., aluminum layer 108 in example structure 100) being anodized to form the porous region, reducing hard mask cracking. The reduction in hard mask cracking improves device reliability by reducing defects due to short-circuit contacts within the structure deposited inside the porous region and/or corrosion within the non-anodized section of the metal layer.

In an embodiment, the ductile hard mask comprises a metal. The use of a metal hard mask allows for better control of the electrical field at the boundary(ies) of the metal layer section being anodized than using traditional hard masks, such as silicon oxide for example. This results in better formed pores at the boundary(ies) and reduces the size of "dead-zones" at the periphery of the deposited structure within the porous region. This enables smaller size structures (e.g., smaller capacitors) to be obtained, which is advantageous in order to meet the requirements of certain applications as well as because smaller size structures typically have higher yield than larger size structures.

In accordance with the above discussed features, a method of fabricating a semiconductor device according to an embodiment of the present invention is described with reference to FIGS. 6A to 6E. The semiconductor device may include a high-density integrated capacitor structure.

Figure 6A:
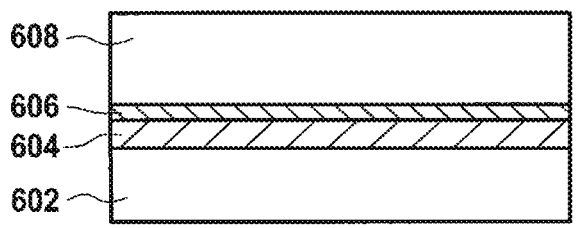
FIGS. 6A to 6E illustrate stages in an example method of manufacturing a PAA embedded structure according to an embodiment.

The fabrication method may include, as shown in FIG. 6A, forming a first metal layer 604 above a silicon layer 602, and forming a second metal layer 608 above the first metal layer 604. In embodiments, the first metal layer 604 may be made of aluminum, copper (Cu), silver (Ag), or aluminum copper (AlCu) combined or not with barrier metals such as titanium, titanium nitride, tantalum, tantalum nitride. The second metal layer 608 may be made of aluminum, though other metals such as titanium or tungsten may also be used. Preferably, the metal used for the second metal layer 608 is a metal that anodizes to provide a well-organized porous region. In an embodiment, the method may further include forming a barrier layer 606 on top of the first metal layer 604 and forming the second metal layer 608 on top of the barrier layer 606. The barrier layer 606 may be similar to barrier layer 106 described above and may be made of Tungsten for example.

Figure 6B:
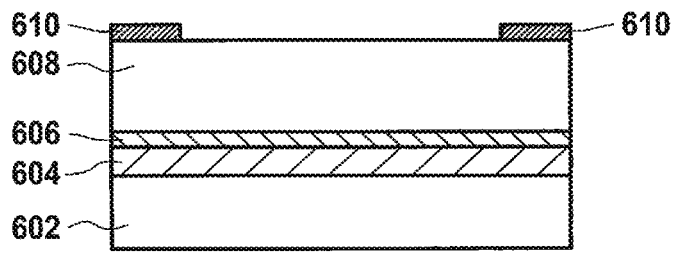

Subsequently, as shown in FIG. 6B, the method includes depositing a ductile hard mask 610 above the second metal layer 608 to define a section within the second metal layer 608. In an embodiment, the defined section corresponds to a region of the second metal layer 608 where the hard mask 610 is open, i.e., where anodization of the second metal layer 608 is desired.

Figure 6C:
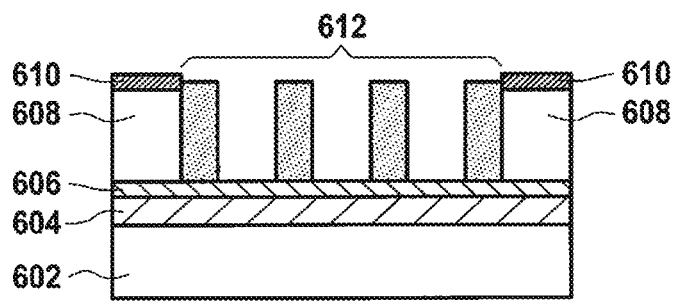
Figure 6D:
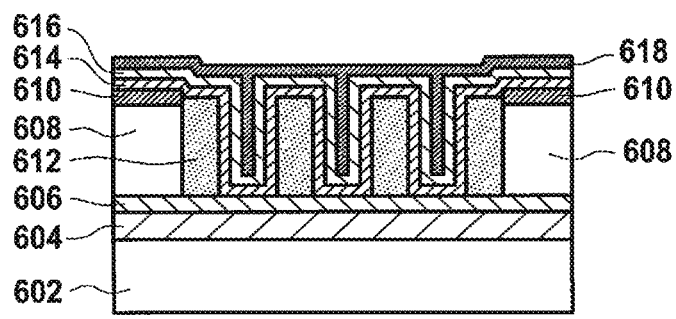

Next, as shown in FIG. 6C, the method includes anodizing the section of the second metal layer 608 defined by the ductile hard mask 610 to form a porous region 612 comprising an anodic oxide layer having pores. In an embodiment, this comprises multiple steps, including a first anodization step, an etching step, and a second anodization step. The first anodization step forms an anodic oxide layer having shallow pores on top of the second metal layer 608. The formed anodic oxide layer is then etched resulting in the top surface of second metal layer 608 developing a texture that defines the eventual pore locations. The second anodization step completes the anodization of second metal layer 608 to form the pores as shown in FIG. 6C, stopping at barrier layer 606.

In an embodiment, the use of a ductile hard mask allows for reducing the thickness of the deposited hard mask 610 compared to the prior art. For example, traditionally, hard masks of at least 1 micron are needed. With a ductile hard mask, the thickness of the hard mask 610 may be reduced below 1 micron. For example, in embodiments, a hard mask 610 in the range of 300 nanometers to 1 micron may be used, depending on the thickness of the second metal layer 608 being anodized.

The use of a ductile hard mask also reduces cracking in the hard mask 610, which traditionally occurs during anodization around the interface(s) between the hard mask 610, the anodized section, and the non-anodized section of the second metal layer 608 (hereinafter "hard mask interfaces"). As the volume of the section being anodized grows due to anodization, the hard mask 610 deforms, with no or minimal cracking, on top of the second metal layer 608. This improves device reliability by reducing defects due to short-circuit contacts within the structure deposited inside the porous region and/or corrosion within the non-anodized section of the metal layer.

In an embodiment, the ductile hard mask 610 is selected so as to self-repair cracks that would be caused by the volume increase of the section of the second metal layer 608 being anodized. In an embodiment, this includes configuring the hard mask 610 to oxidize where a crack would occur but just enough to fill the crack. In an embodiment, configuring the hard mask 610 includes appropriately selecting the material and the thickness of the ductile hard mask 610, as a function of the anodization electrolyte, to result in a controlled oxidization of the hard mask 610 where the crack occurs in order to fill the crack and stop further oxidization afterwards.

In an embodiment, the ductile hard mask 610 comprises a metal. The metal may be, without limitation, titanium, tantalum, or a metal of equivalent properties, for example. In an embodiment, where the ductile hard mask 610 is a metal, the method of fabricating the semiconductor device further comprises selecting an electrolyte for anodizing the section of the second metal layer 608 defined by the ductile hard mask; and selecting the metal of the ductile hard mask 610 such that it forms a stable oxide when exposed to the selected electrolyte. In an embodiment, the second metal layer 608 may be made of aluminum and the electrolyte may include, for example, an organic acid such as an oxalic acid or a carboxylic acid or an inorganic acid such as a sulfuric acid or a phosphoric acid. However, embodiments are not limited by these example materials for the second metal layer 608 and/or the electrolyte. The selection of the metal of the ductile hard mask 610 to form a stable oxide when exposed to the selected electrolyte enables the hard mask 610 to self-repair if a crack occurs during the anodization process. As the crack exposes the metal to the electrolyte leading to its oxidation, the stability (insolubility) of the formed oxide allows the formed oxide, which is larger in volume than the metal it replaces, to plug the crack.

In an embodiment, the formed porous region 612 is characterized by narrower dead-zones than in the prior art by virtue of the use of a metal for the ductile hard mask 610. Specifically, the use of a metal hard mask allows for better control of the electrical field at the boundary(ies) of the section of second metal layer 608 being anodized than using traditional hard masks, such as silicon oxide for example. This results in better formed pores of the anodic oxide layer at the boundaries and reduces the size of dead-zones at the periphery of the deposited structure within the porous region. The reduction in the size of dead-zones enables smaller size structures (e.g., smaller capacitors) to be obtained. This is advantageous in order to meet the requirements of certain applications as well as because smaller size structures typically have higher yield than larger size structures.

Figure 6E:
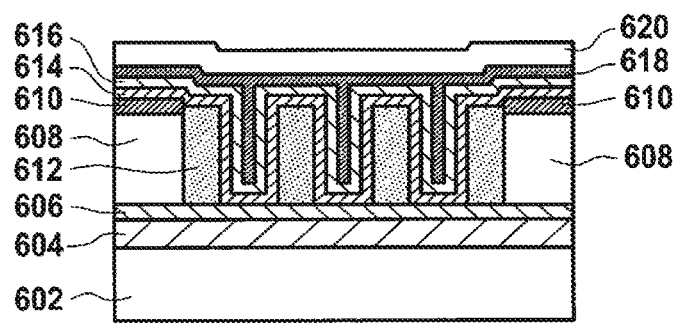

Returning to FIGS. 6A-6E, as shown in FIG. 6D, the fabrication method next includes depositing a structure, including a first conductive layer 614, a first insulator layer 616 covering the first conductive layer 614, and a second conductive layer 618 covering the first insulator layer 616, inside the pores of the porous region 612. Finally, as shown in FIG. 6E, the method includes forming a third metal layer 620 above the deposited structure.

In an embodiment, the deposited structure provides a capacitor and the first and third metal layers 604 and 620 provide top and bottom electrodes for the capacitor. The use of a metal hard mask 610 simplifies the process of contacting the bottom electrode (the first metal layer 604) from the top of the structure. Being metal and conductive in this case, the hard mask 610 no longer needs to be etched to enable electrical contact to be made to the second metal layer 608 and the first metal layer 604 of the semiconductor device.

In accordance with the above discussed features, the present invention also provides a semiconductor device. The semiconductor device may be fabricated using the method described above and may include any of the structures shown in FIGS. 6A-6E. In an embodiment, the semiconductor device comprises: a silicon layer; a first metal layer, above the silicon layer; a second metal layer above the first metal layer; and a ductile hard mask, above the second metal layer, defining a porous region within the second metal layer, the porous region comprising an anodic oxide layer having pores.

The above-described semiconductor device may be an intermediate product formed during the manufacture of a product according to the invention.

In an embodiment, the semiconductor device further comprises a structure comprising a first conductive layer, a first insulator layer covering the first conductive layer, and a second conductive layer covering the first insulator layer, formed inside the pores of the porous region; and a third metal layer, above the structure.

In an embodiment, the semiconductor device includes a capacitor provided by the structure formed in the porous region. The first and third metal layers provide top and bottom electrodes for the capacitor.

The ductile hard mask may be a metal, such as titanium, tantalum, or a metal of equivalent properties, for example. In an embodiment, the porous region is formed by anodizing a section of the second metal layer using an electrolyte, and the metal is characterized by forming a stable oxide when exposed to the electrolyte. The stability of the oxide also means that plugged cracks are not dissolved post-manufacture due to exposure to any electrolyte residue inside the device.

Figure 1:
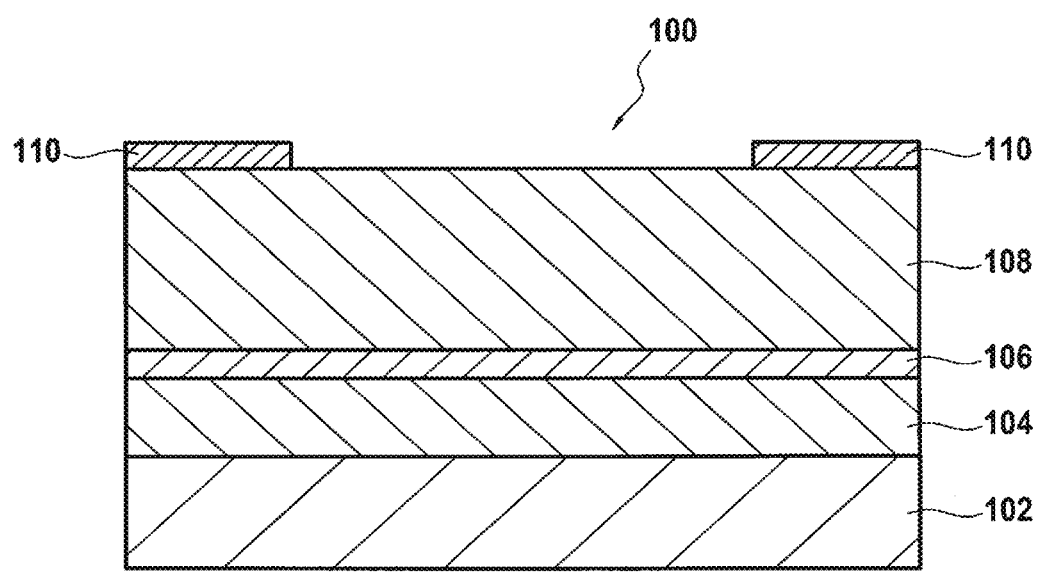
FIG. 1 is a cross-section view of an example structure used in fabricating a product having a porous region.
Figure 2A:
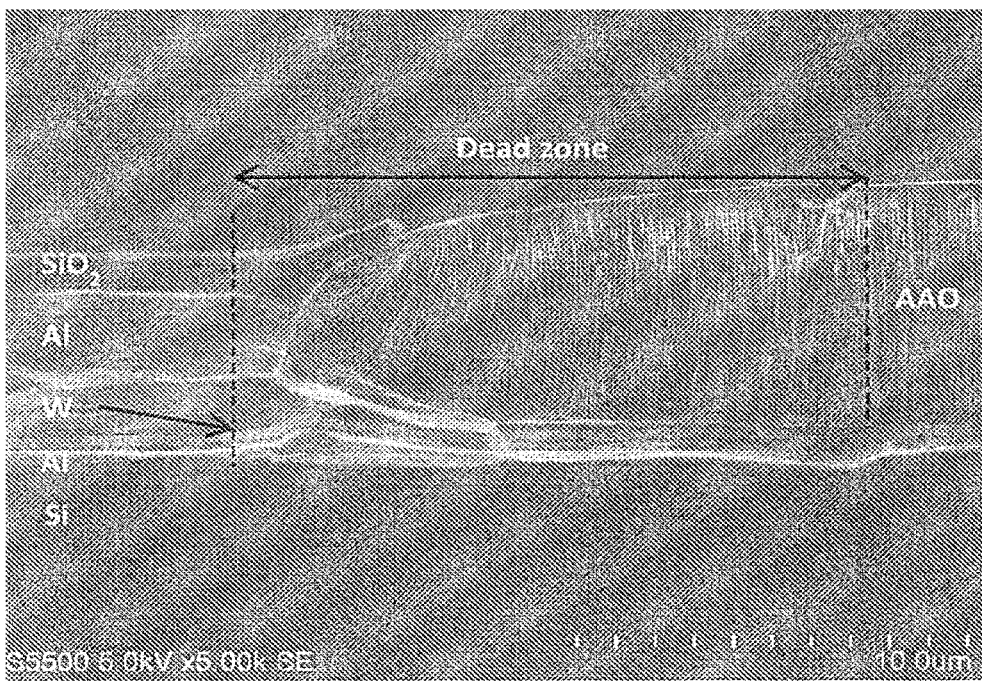
FIGS. 2A and 2B are scanning electron microscopy (SEM) images of an example porous region.
Figure 2B:
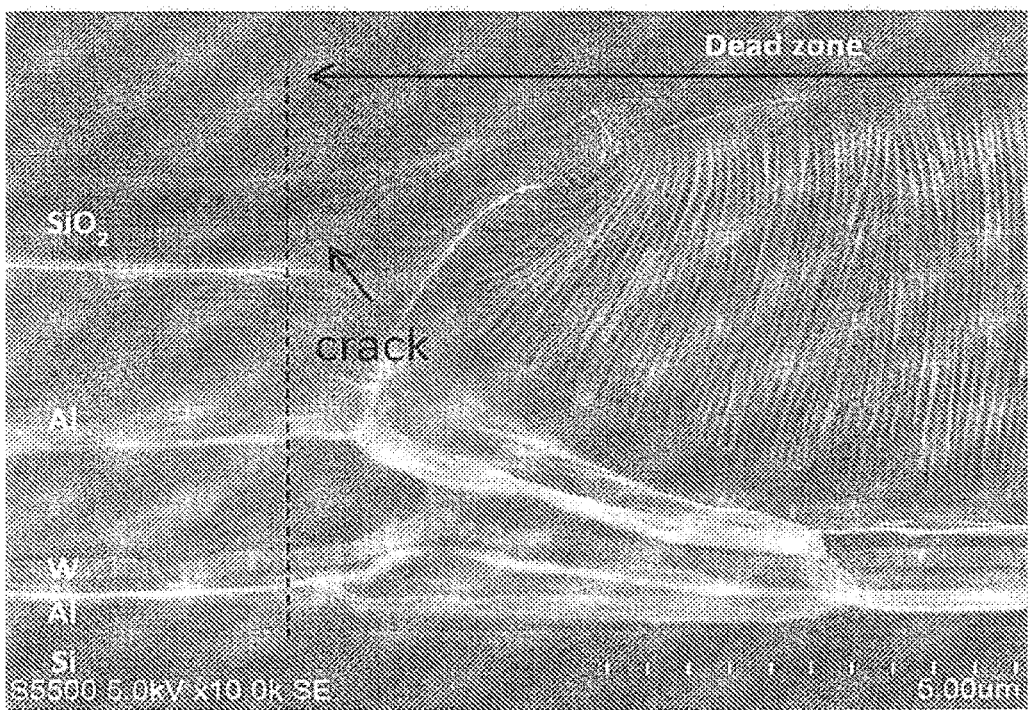
Figure 3:
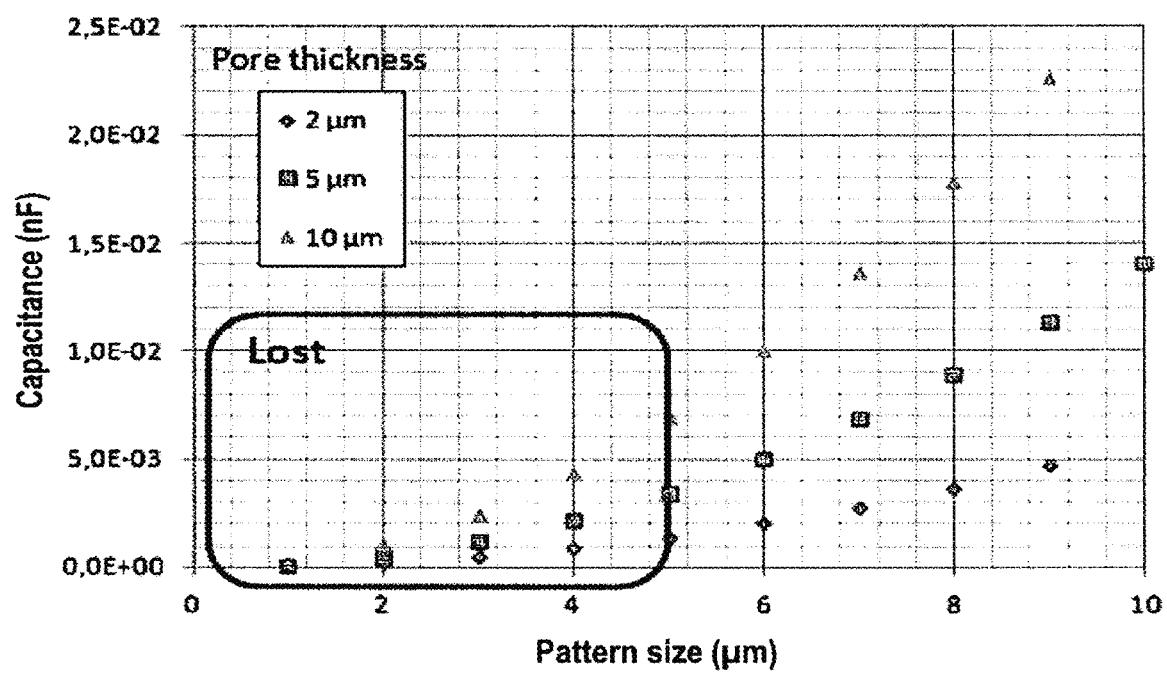
FIG. 3 is a graph that illustrates the relationship between the capacitance of an example PAA embedded structure and the size of the structure for different pore depth values.
Figure 4A:
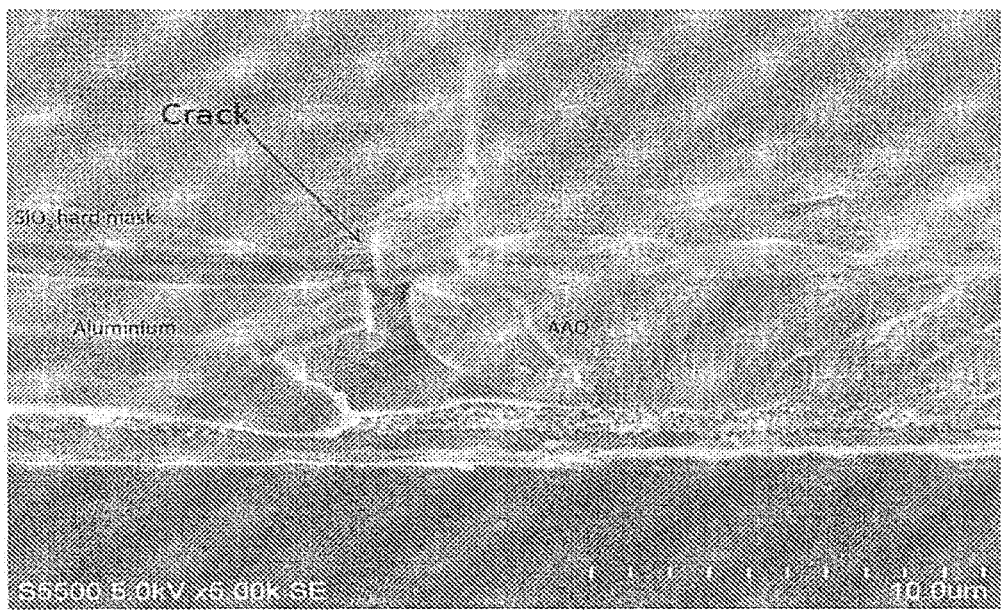
FIGS. 4A and 4B are SEM images that illustrate example cracks that may occur in a silicon dioxide hard mask in forming a PAA embedded structure.
Figure 4B:
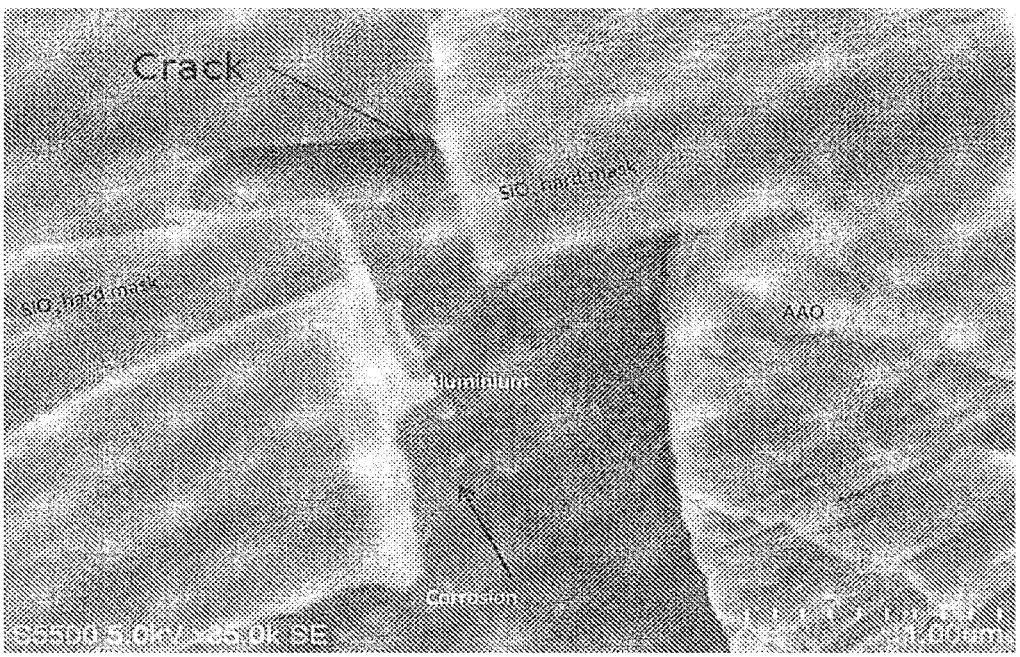
Figure 5:
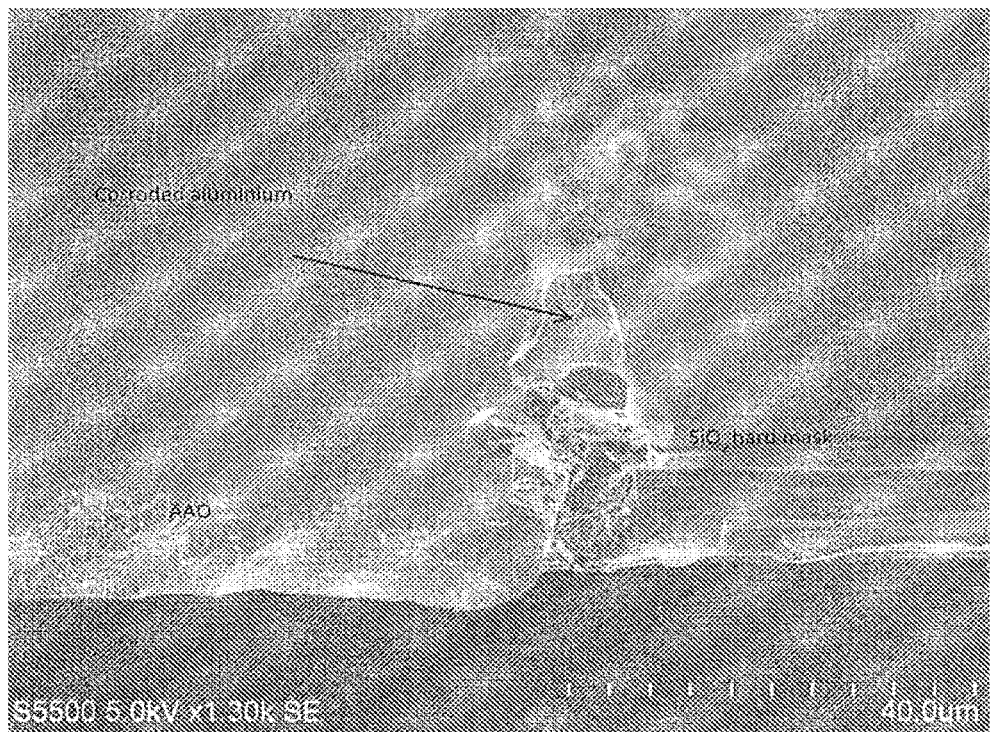
FIG. 5 is an SEM image of an example porous region which illustrates corrosion in an underlying metal layer due to cracking of the hard mask.
Figure 7A:
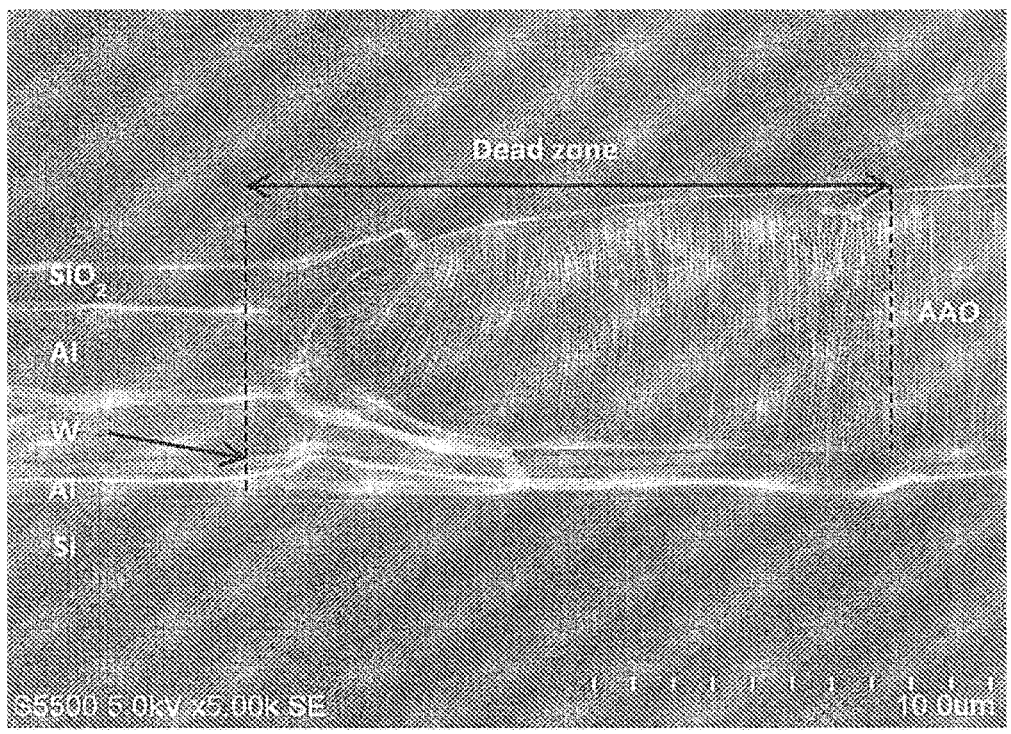
Figure 7B:
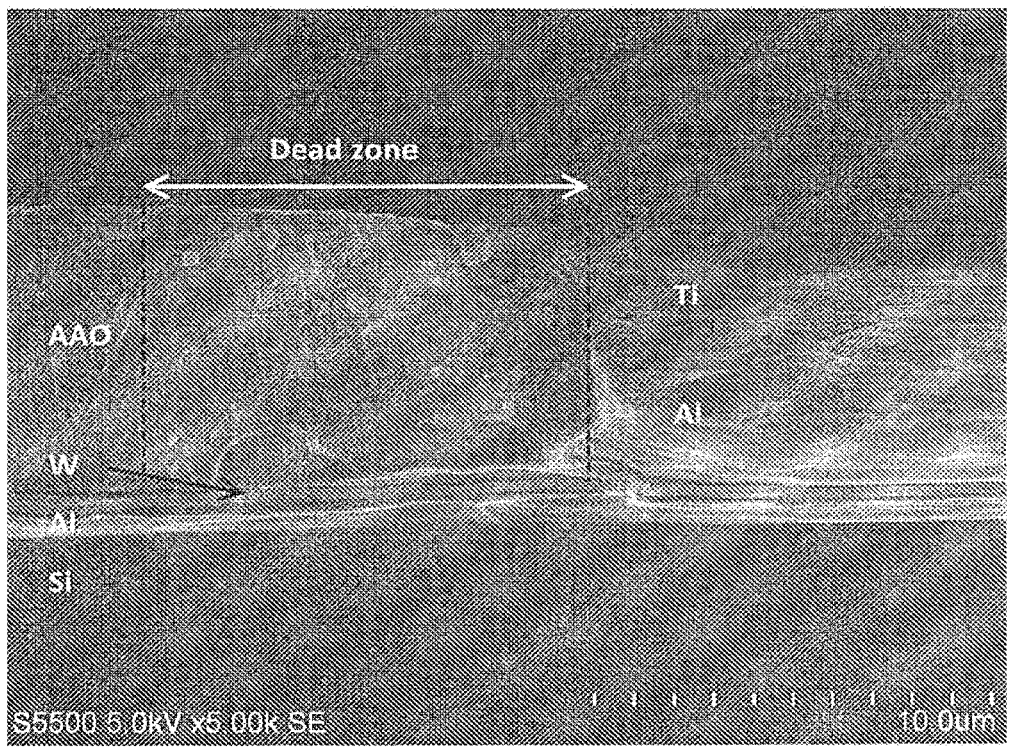

The selection of the hard mask (e.g., ductility, material, thickness) in accordance with embodiments of the present invention results in an improved product compared to the prior art. For the purpose of comparison, SEM images of example porous regions formed in accordance with the prior art and in accordance with an embodiment of the present invention are presented respectively in FIGS. 7A and 7B. Specifically, FIG. 7A shows a zoomed-in (5000× magnification) cross-section view of an edge of a porous region formed using a silicon dioxide hard mask. An equivalent zoomed-in (5000× magnification) cross-section view of an edge of a porous region formed using a titanium hard mask, in accordance with an embodiment of the present invention, is shown in FIG. 7B. Both porous regions were formed using the same layer stack described above with reference to FIG. 1.

Comparison of the two porous regions reveals noticeable enhancement according to the present invention. In particular, as shown in FIG. 7B, a significant reduction (approximately 50%) in the size of the dead-zone of the porous region is achieved. This reduction ensures that a greater portion of the porous region is useable to host integrated structures (e.g., MIM structures). In addition, the reduction means that a greater range of capacitance values, particularly smaller capacitance values, can be more easily realized. More importantly, no cracking is visible in the titanium hard mask layer, despite it having a lower thickness than the silicon dioxide hard mask in this example. The absence of cracking means that the resulting product is less prone to the defects of prior art products discussed above (e.g., short-circuit contacts, corrosion, etc.).

ADDITIONAL VARIANTS

Although the present invention has been described above with reference to certain specific embodiments, it will be understood that the invention is not limited by the particularities of the specific embodiments. Numerous variations, modifications and developments may be made in the above-described embodiments within the scope of the appended claims.

Thus, although the examples described above refer to an MIM type structure embedded in the pores of a porous region, the invention is not limited to this type of embedded structure; other structures, for example, an MIMIM structure, and others, may be used. In another aspect, although a ductile hard mask is preferred as described above, in other embodiments a non-ductile material may be used for the hard mask so long as the stress induced in the hard mask by the growth of the anodic oxide does not exceed the ultimate tensile stress of the hard mask barrier consisting of oxide material formed when the hard mask is exposed to the anodization electrolyte. In an embodiment, this is achieved by adjusting the thickness of the hard mask in the area(s) where the strain is highest. Metals that may be used in such embodiments include molybdenum and tungsten for example.

The invention claimed is:

1. A semiconductor device, comprising:
   a silicon layer;
   a first metal layer above the silicon layer;
   a second metal layer above the first metal layer; and
   a ductile metal hard mask, above the second metal layer, defining a porous region within the second metal layer, the porous region comprising an anodic oxide layer having pores,
   wherein the porous region is an anodized section of the second metal layer, and wherein the ductile metal hard mask is deformed, but has no cracks, despite a volume increase of the section of the second metal layer during anodization.

2. The semiconductor device of claim 1, wherein the ductile metal hard mask comprises a metal.

3. The semiconductor device of claim 2, wherein the porous region is formed by anodizing a section of the second metal layer using an electrolyte, and wherein the metal is characterized by forming a stable oxide when exposed to the electrolyte.

4. The semiconductor device of claim 3, wherein the electrolyte comprises an organic acid or an inorganic acid.

5. The semiconductor device of claim 1, wherein the ductile metal hard mask is characterized by self-repairing a crack caused by the volume increase of the section of the second metal layer during anodization.

6. The semiconductor device of claim 1, wherein a thickness of the ductile metal hard mask is under 1 micron.

7. The semiconductor device of claim 1, further comprising:
   a structure comprising a first conductive layer, a first insulator layer covering the first conductive layer, and a second conductive layer covering the first insulator layer, the structure formed inside the pores of the porous region; and
   a third metal layer, above the structure.

8. A method of fabricating a semiconductor device, comprising:
   forming a first metal layer above a silicon layer;
   forming a second metal layer above the first metal layer;
   depositing a hard mask above the second metal layer to define a section within the second metal layer;
   anodizing the section of the second metal layer defined by the hard mask to form a porous region comprising an anodic oxide layer having pores, wherein the hard mask is a metal that is ductile during the anodization; and
   selecting the ductile metal hard mask so as to deform with no cracking to accommodate a volume increase of the section of the second metal layer during anodization.

9. The method of claim 8, wherein the ductile metal hard mask comprises a metal.

10. The method of claim 9, further comprising:
    selecting an electrolyte for anodizing the section of the second metal layer defined by the ductile metal hard mask; and
    selecting the metal such that it forms a stable oxide when exposed to the selected electrolyte.

11. The method of claim 10, wherein the electrolyte comprises an organic acid or an inorganic acid.

12. The method of claim 8, wherein a thickness of the ductile metal hard mask is under 1 micron.

13. The method of claim 8, further comprising selecting the ductile metal hard mask so as to self-repair a crack caused by the volume increase of the section of the second metal layer during anodization.

14. The method of claim 8, further comprising:
    depositing a structure comprising a first conductive layer, a first insulator layer covering the first conductive layer, and a second conductive layer covering the first insulator layer inside the pores of the porous region; and
    forming a third metal layer above the structure.

* * * * *